United States Patent [19]
Sato et al.

[11] Patent Number: 5,745,353
[45] Date of Patent: Apr. 28, 1998

[54] SNUBBER CIRCUIT THAT SUPPRESSES SURGE AND RUSH CURRENT FLOWING TO A SWITCHING ELEMENT OF A SELF EXCITATION-TYPE FLYBACK POWER SUPPLY

[75] Inventors: Morio Sato, Saitama-ken; Kenichiro Momose, Kanagawa-ken; Tadao Saito, Kanagawa-ken; Takao Kusaka, Kanagawa-ken, all of Japan

[73] Assignee: Kabushiki Kaisha Toshiba, Kanagawa-ken, Japan

[21] Appl. No.: 403,857

[22] PCT Filed: Sep. 22, 1993

[86] PCT No.: PCT/JP93/01357

§ 371 Date: Jul. 12, 1995

§ 102(e) Date: Jul. 12, 1995

[87] PCT Pub. No.: WO94/07300

PCT Pub. Date: Mar. 3, 1994

[30] Foreign Application Priority Data

Sep. 24, 1992 [JP] Japan ................................. 4-076388
Jan. 14, 1993 [JP] Japan ................................. 5-004632

[51] Int. Cl.$^6$ ............................................. H02H 7/122
[52] U.S. Cl. ................... 363/56; 363/19; 363/131
[58] Field of Search ............................. 363/18, 19, 20, 363/21, 560, 131

[56] References Cited

U.S. PATENT DOCUMENTS

| | | | |
|---|---|---|---|
| 4,031,453 | 6/1977 | Teuling | 363/20 |
| 4,353,113 | 10/1982 | Billing | 363/21 |
| 4,510,562 | 4/1985 | Maeba | 363/19 |
| 4,888,672 | 12/1989 | Hiramatsu et al. | 363/19 |
| 5,499,175 | 3/1996 | Noro | 363/19 |
| 5,515,256 | 5/1996 | Yokoyama | 363/21 |

FOREIGN PATENT DOCUMENTS

| | | | |
|---|---|---|---|
| 55-3695 | 1/1980 | Japan | H01F 41/02 |
| 59-32217 | 9/1984 | Japan | H02M 3/28 |
| 60-15908 | 1/1985 | Japan | H01F 27/24 |
| 61-39860 | 2/1986 | Japan | H02M 3/338 |
| 61-26302 | 6/1986 | Japan | H02M 3/28 |
| 62-48364 | 10/1987 | Japan | H01F 27/24 |
| 63-143086 | 9/1988 | Japan | H02M 3/28 |
| 2-183508 | 7/1990 | Japan | H01F 27/24 |
| 4-251902 | 9/1995 | Japan | H01F 27/24 |

*Primary Examiner*—Jeffrey L. Sterrett
*Attorney, Agent, or Firm*—Finnegan, Henderson, Farabow, Garrett & Dunner, L.L.P.

[57] ABSTRACT

A snubber circuit is possessed of a saturable inductor made of an amorphous alloy and connected in series to a drive circuit for a switching element. A switching power source is a flyback type self-excitation or separate excitation switching power source having a saturable inductor connected in series between a switching element connected in series to a primary winding of a transformer and a drive circuit for actuating the switching element. The saturable inductor connected in series to the switching element serves the purpose of improving efficiency and curbing noise. The saturable inductor of this invention is adapted for use in the snubber circuit and the switching power source mentioned above and has an exciting current, $I_{ex}$, of not more than 3 (A) and an amount of magnetic flux, $\Phi$ (Wb/m$^2$), in the range of from 2 to 20% of the product of the operating period, T (sec), multiplied by the circuit voltage (V).

17 Claims, 4 Drawing Sheets

SNUBBER CIRCUIT THAT SUPPRESSES SURGE AND RUSH CURRENT FLOWING TO A SWITCHING ELEMENT OF A SELF EXCITATION-TYPE FLYBACK POWER SUPPLY

TECHNICAL FIELD

This invention relates to a snubber circuit, a switching power source, and a saturable inductor for use therein.

BACKGROUND ART

Heretofore, bipolar transistors have been mainly used as switching elements for switching power sources. In recent years, the demands for diminishing sizes and weights of switching power sources have been urging an increase in the operating frequency of such switching power sources. As a measure for this increase, the use of field effect transistors (hereinafter referred to as "FET") has been in vogue.

High-speed switching is realized when a FET is used as a switching element as described above. Since an electric current suddenly flows into a gate capacity (hereinafter referred to as "rush current") while the FET is ON, however, there arises the problem of an increased loss due to the emission of noise from the FET or the instantaneous increase of the electric current flowing to the FET. To solve this problem, measures such as parallelly connecting a snubber circuit, such as a CR snubber consisting of a capacitor C and a resistor R, to the FET thereby depriving the voltage of oscillation by absorption and preventing the electric current from producing a sudden change, are adopted.

Not exclusively in the case of using a FET, the practice of parallelly connecting to a switching element a snubber circuit such as a snubber capacitor in the switching power source is prevailing. It serves to prevent the voltage from suddenly rising at the moment that the switching element is turned off and, at the same time, repress the surge voltage which is emitted by the leakage inductance of a transformer. By these measures, the switching element is protected and, at the same time, the external leakage of noise is diminished.

FIG. 7 illustrates one example of the circuit of the conventional flyback type switching power source which is adapted to use the self-oscillation of a blocking oscillator. In the flyback type switching power source shown in this diagram, a primary winding 4 of a transformer 3 and a FET 5 are connected in series between input terminals 1 and 2 and the transformer 3 is provided with a winding 6 for actuating the gate circuit of the FET 5. Between the gate circuit of the FET 5 and the winding 6 for driving the FET, a resistor 8 for optimizing the electric current level and a capacitor 7 for improving the operating characteristics are connected in series. Between the primary winding 4 of the transformer 3 and the input terminal 2, a snubber capacitor 9 and a snubber resistor 10 are connected in parallel to the FET 5 to protect the FET 5.

To a secondary winding 11 of the transformer 3 is connected a rectifying element 12. Outlet terminals 13 and 14 are also connected to the secondary winding 11. A capacitor 15 which is connected in parallel between the output terminals 13 and 14 is adapted to smooth the output in conjunction with the rectifying element 12. A resistor 16 is a load.

Incidentally, in the switching power source constructed as described above, such snubber circuits as the CR snubbers (9, 10) must be given an increased size in order to preclude emission of noise. The increased size inevitably adds to the loss due to the snubber circuits and the loss ironically poses itself a problem. It further entails the problem that when the switching element is turned on, the energy of the CR snubbers flows into the switching elements and functions therein as a surge current to bring about emission of noise and degradation of efficiency.

Particularly, in the flyback type switching power source using self-oscillation, the primary inductance component of the transformer and the capacity such as of the capacitors of the snubber circuits jointly generate resonance during the interval of shift from the ON period to the OFF period. The resonance entails the problem that the switching element is actuated during the resonance, depending on the capacity, and the energy accumulated in the capacity, such as the capacitors of the snubber circuits, flows into the switching element in a fashion similar to a short circuit and entails loss of electric power and emission of noise. For the purpose of solving this problem, there now prevails the practice of furnishing the switching power source with a timing circuit which is adapted to prevent the switching element from being turned on during the life of the resonance by detecting the voltage or amperage of the resonance and allowing the main switch to be turned on at the moment that the resonance is terminated. The incorporation of this timing circuit, however, raises the problem that the circuitry gains in complexity and the equipment grows in cost.

In the conventional switching power source, for the purpose of relying on such snubber circuits as the CR snubbers to protect the gate capacity of the FET, for example, against rush current as described above, these snubber circuits must be large in size. The enlargement of size inevitably adds to the loss due to the snubber circuits and this loss poses a problem. Further, the flyback type switching power source in particular entails the problem that the energy accumulated in the capacity, such as of capacitors in the snubber circuits, flows into the switching element after the fashion of a short circuit and gives rise to loss of electric power and emission of noise. The prevention of this trouble necessitates addition of such a complicated circuit as the timing circuit.

An object of this invention is to provide a snubber circuit which realizes by means of a simple configuration the effective prevention of the entry of a rush current into such a switching element as the FET, particularly of the emission of noise and the degradation of efficiency owing to the surge current such as from the snubber capacitors in the flyback type switching power source. Another object of this invention is to provide a flyback type switching power source which provides for the repression of noise and the enhancement of efficiency by the use of simple circuitry. A further object of this invention is to provide a saturable inductor ideally adapted for the snubber circuit and the switching power source mentioned above.

DISCLOSURE OF THE INVENTION

The snubber circuit of this invention is intended to be provided in the drive circuit of a switching element and is characterized by being furnished with a saturable inductor which is connected in series to the drive circuit and has an exciting current, $I_{ex}$, of not more than 3 (A), and an amount of magnetic flux, $\Phi$ (Wb/m$^2$), in the range of from 2 to 20% of the product of the operating period, T(sec), multiplied by the circuit voltage, E(V).

The flyback type switching power source of this invention is characterized by being provided with a transformer possessed of a primary and a secondary winding, a switching element connected in series to the primary winding of the transformer, a drive circuit for actuating the switching element, and a saturable inductor, which is, connected in series between the switching element and the drive circuit and has an exciting current, $I_{ex}$, of not more than 3 (A), and an amount of magnetic flux, $\Phi$ (Wb/m$^2$), in the range of from 2 to 20% of the of the operating period, T(sec), multiplied by the circuit voltage, E(V).

The saturable inductor of this invention is intended for use in the snubber circuit and switching power source as described above and is characterized in that the exciting current, $I_{ex}$, thereof is not more than 3 (A) and the amount of magnetic flux, $\Phi$ (Wb/m$^2$), thereof is in the range of from 2 to 20% of the product of the operating period, T (sec), multiplied by the circuit voltage, E (V).

In the snubber circuit of this invention, when the ON voltage is applied to the drive circuit of the switching element, no sufficient voltage is exerted on the switching element until the saturable inductor is saturated and the assumption of the ON state is substantially delayed because the saturable inductor, which possesses such characteristic properties as mentioned above, is connected in series to the drive circuit of the switching element, that is, the snubber circuit operates as what is called a delay circuit. As a result, the effects of the rush current and the surge current as from the snubber capacitor can be repressed.

The snubber circuit of this invention is applied to such switching elements as bipolar transistors and FET's. To be specific, in cases where a FET is used as a switching element, for example, when the ON voltage is applied to the gate circuit of the FET, no sufficient voltage is exerted on the gate of the FET until the saturable inductor is saturated and the assumption of the ON state by the FET can be substantially delayed and the occurrence of such phenomena as rush current can be repressed.

In the switching power source of this invention similar in function to the snubber circuit mentioned above, when the ON voltage is applied to the drive circuit, no sufficient voltage is exerted on the switching element until the saturable inductor is saturated and the assumption of the ON state by the switching element is substantially delayed because the saturable inductor, which possesses such characteristic properties as mentioned above, is connected in series between the switching element and the drive circuit thereof. That is, the snubber circuit operates as what is called a delay circuit. As a result, the effects of the rush current and the surge current as from the snubber capacitors can be notably curbed and the efforts to lower the noise of the switching power source and enhance the operational efficiency thereof can be materialized.

The flyback type switching power source of this invention is not restricted by the method by which the switching element is driven but may be applied equally to a self-excitation and a separate excitation switching element. In the self-excitation switching power source, for example, the saturable inductor, which possesses such characteristic properties as mentioned above, is connected in series between the switching element and the positive feedback winding of a transformer for self-exciting the switching element. In the separate excitation switching power source, the saturable inductor, which possesses such characteristic properties as mentioned above, is connected in series between the switching element and an oscillation circuit for actuating the switching element.

The saturable inductor for use in the snubber circuit and the switching power source mentioned above is an inductor which is adapted to use a core in the saturated state thereof and does not particularly necessitate any such device as a control circuit. The shape of the saturable inductor is not particularly limited. As concrete examples of this shape, a bead of core (having a line inserted through an empty core part thereof) made of a varying magnetic material, the bead of core provided with a plurality of windings, and an ordinary toroidal core provided with a winding may be cited.

The saturable inductor to be used in the snubber circuit or the switching power source mentioned above is required to satisfy the conditions that the exciting current, $I_{ex}$, thereof be not more than 3 (A) and the amount of magnetic flux, $\Phi$ (Wb/m$^2$), thereof be in the range from 2 to 20% of the product of the operating period, T (sec), multiplied by the circuit voltage (V). The saturable inductor of this invention fulfills the conditions mentioned above. As one of the characteristic properties of the saturable inductor, the exciting current, $I_{ex}$, is specified to be not more than 3 (A). The reason for this upper limit is that if the exciting current is unduly large, the effect of curbing noise will be low and the operational efficiency will be low also. The desirable magnitude of the exciting current is not more than 1 A, preferably in the range of from 0.3 to 0.6 A. The exciting current, $I_{ex}$, is expressed by the following formula.

$$I_{ex}=(H_c \times l)/n$$

(wherein $H_c$ stands for the coercive force at the operating frequency, l for the length of a magnetic path, and n for the number of turns).

In this invention, besides the exciting current mentioned above, the amount of magnetic flux, $\Phi$ (Wb/m$^2$), as the other characteristic property of the saturable inductor, is specified to be in the range of from 2 to 20% of the product of the operating period, T (sec), multiplied by the circuit voltage, E (V). The reason for this range is that if the product of the operating period T multiplied by the circuit voltage E is unduly large relative to the amount of magnetic flux, $\Phi$, the effect of curbing the noise will be gradually lowered and, at the same time, the operational efficiency will be lowered. Conversely, if the product of the operating period T multiplied by the circuit voltage E is unduly small relative to the amount of magnetic flux, $\Phi$, the effect of curbing the noise will be suddenly lowered and, at the same time, the operational efficiency will be lowered. The desirable range of the amount of magnetic flux, $\Phi$, is from 2 to 15%, preferably from 5 to 10%, of the product of the operating period T multiplied by the circuit voltage E.

The saturable inductor for use in the snubber circuit or the switching power source of this invention may be made of a varying material so long as it satisfies the conditions mentioned above. As concrete examples of the material for the construction of the saturable inductor, ferrites, iron-nickel type soft magnetic alloys, cobalt (Co)-based and iron (Fe)-based amorphous soft magnetic alloys, and iron-based soft magnetic alloys formed of microcrystalline grains (hereinafter referred to as "Fe-based microcrystalline alloys") may be cited.

Among other materials mentioned above, the amorphous alloys and the Fe-based microcrystalline alloys prove to be particularly suitable materials for this invention because they show only a low loss at a high frequency range, possess such excellent characteristic properties as a high squareness ratio at the operating frequency of the switching power source and a small coercive force ($H_c$), and permit easy repression of the exciting current, $I_{ex}$, mentioned above at a low level.

As concrete examples of the Co-based amorphous alloy mentioned above, the alloys of compositions which are represented substantially by the following general formula:

[wherein M stands for one element selected from the group consisting of Fe and Mn, M' for one or more members selected from the group consisting of transition metals except Fe and Mn, X for one or more members selected from the group consisting of Si, B, P, and C, and a, b, c, and d stand for numerals satisfying $60 \leq a \leq 80$, $0 \leq b \leq 10$, $0 \leq c \leq 10$, and $a+b+c+d=100$ (at %)] may be cited. As the element of M' mentioned above, Cr, Ni, Nb, Mo, W, Zr, Ti, V, Ta, Hf, Re, Cu, and Y are advantageously used.

As concrete examples of the Fe-based amorphous alloy mentioned above, the alloys of compositions which are represented substantially by the following general formula:

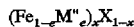

[M" stands for at least one element selected from the group consisting of Ti, V, Cr, Mn, Ni, Co, Zr, Nb, Mo, Ru, Hf, Ta, W, Re and rare earth elements, X for one or more elements selected from the group consisting of Si, B, P, and C, and e and x stand for numerals satisfying $0 \leq e \leq 0.12$ and $70 \leq x \leq 85$ (at %)] may be cited.

As concrete examples of the Fe-based microcrystalline alloy mentioned above, the alloys having compositions which are represented substantially by the following general formula:

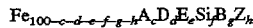

(wherein A stands for at least one element selected from the group consisting of Cu and Au, D for at least one element selected from the group consisting of the elements of the 4A Group, the elements of the 5A Group, the elements of the 6A Group, and rare earth elements, E for at least one element selected from the group consisting of Mn, Al, Ga, Ge, In, Sn and the elements of the platinum group, Z for at least one element selected from the group consisting of C, N, and P, c, d, e, f, g, and h stand for numerals satisfying $0 \leq c \leq 8$, $0.1 \leq d \leq 15$, $0 \leq e \leq 10$, $0 \leq f \leq 25$, $1 \leq g \leq 12$, $0 \leq h \leq 10$, and $1 \leq f+g+h \leq 30$, providing that all the numerals in the expressions given above represent magnitudes of the denomination of at %) and containing microcrystalline particles of an average diameter of not more than 50 nm.

In the saturable inductor of this invention, it is desirable particularly to use a Co-based amorphous alloy or a Fe-based microcrystalline alloy in all the amorphous alloys and Fe-based microcrystalline alloys mentioned above for the purpose of curbing the exciting current, $I_{ex}$, to an amply low level and, consequently, attaining easily the characteristic properties aimed at by this invention.

In this invention, the effectiveness of the saturable inductor increases in proportion as the thickness of the plate of a magnetic alloy for the saturable inductor decreases. The method for the production of the saturable inductor of this invention has no restriction of any sort except that it be capable of manufacturing the product possessing intended characteristic properties.

BEST MODE FOR CARRYING OUT THE INVENTION

Now, this invention will be described specifically below with reference to the annexed drawings illustrating embodiments of the invention.

Figure 1:
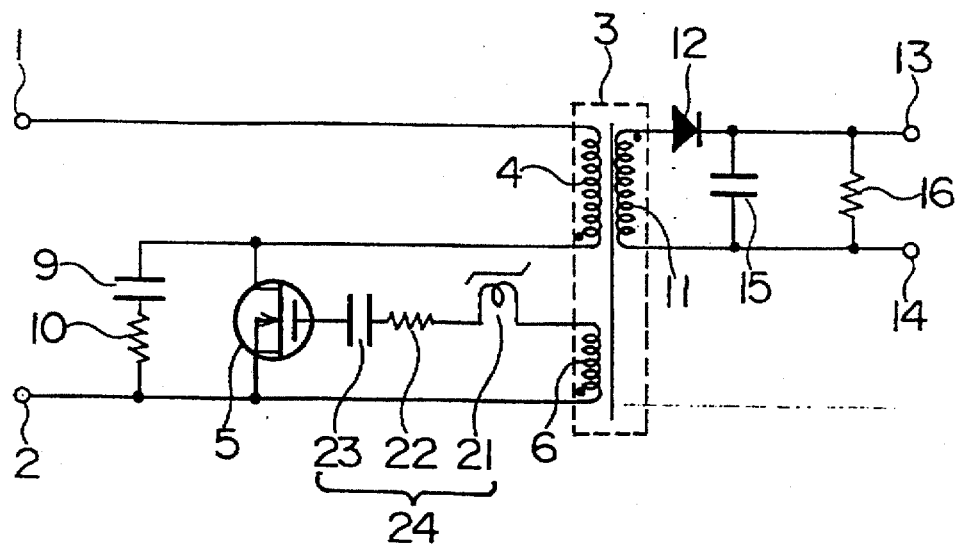
FIG. 1 is a circuit diagram of a flyback type self-excitation switching power source as one embodiment of this invention.

FIG. 1 is a circuit diagram of a flyback type self-excitation switching power source as one embodiment of this invention. This switching power source utilizes the self-excited oscillation of a blocking oscillator and uses a FET as a switching element. It has a snubber circuit of this invention which is provided with a saturable inductor connected in series between a drive circuit of the FET, namely the positive feedback winding of a transformer formed for the purpose of self-exciting the FET, and the FET.

To be specific, a primary winding 4 of a transformer 3 and a FET 5 as a switching element are connected in series between input terminals 1 and 2. As a drive circuit for the FET 5, the transformer 3 is provided with a winding 6 for driving the gate circuit of the FET 5. The winding 6 is the positive feedback winding of the transformer 3 which is intended for self-exciting the FET 5. Between the gate circuit of the FET 5 and the FET driving winding 6 is provided a snubber circuit 24 which has a saturable inductor 21, a resistor 22, and a capacitor 23 connected in series. Here, the resistor 22 is intended to feed a suitable drive current to the FET 5 and the capacitor 23 is adapted to be freely connected for the purpose of enhancing the drive property of the FET 5 and they are desired to be used as severally connected in series to the saturable inductor 21. Between the primary winding 4 of the transformer 3 and the input terminal 2, a snubber capacitor 9 for absorbing the surge voltage generated in the primary winding 4 of the transformer 3 is connected in series. Further, a snubber resistor 10 is connected in series to the snubber capacitor 9 to lower the di/dt ratio of the charging current.

Figure 7:
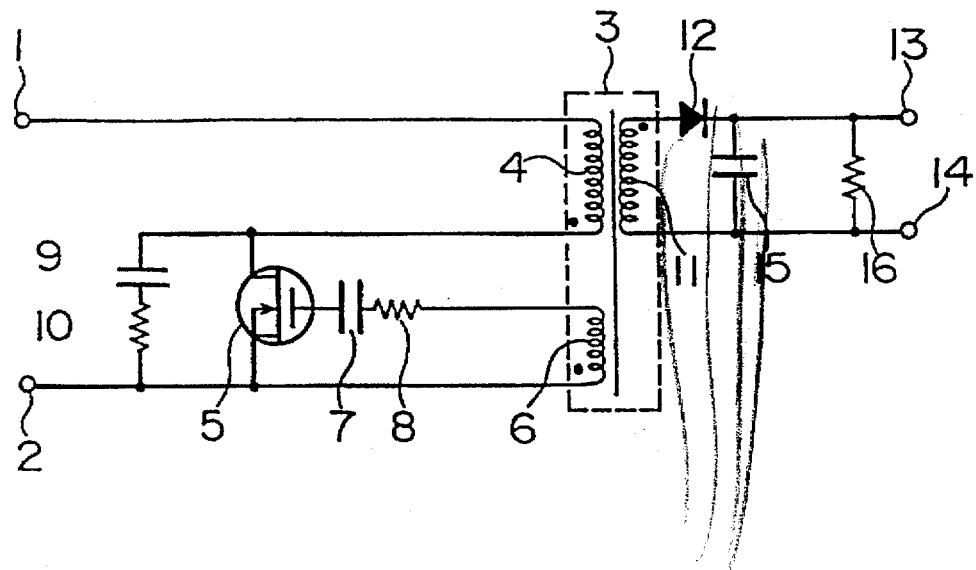
FIG. 7 is a circuit diagram of one example of the conventional flyback type self-excitation switching power source.

Incidentally, the secondary winding 11 side of the transformer 3 in the present switching power source is similar to that in the conventional switching power source shown in FIG. 7 and has a rectifying element 12 and a capacitor 15 connected thereto so as to serve jointly as an output smoothing circuit.

Figure 2:
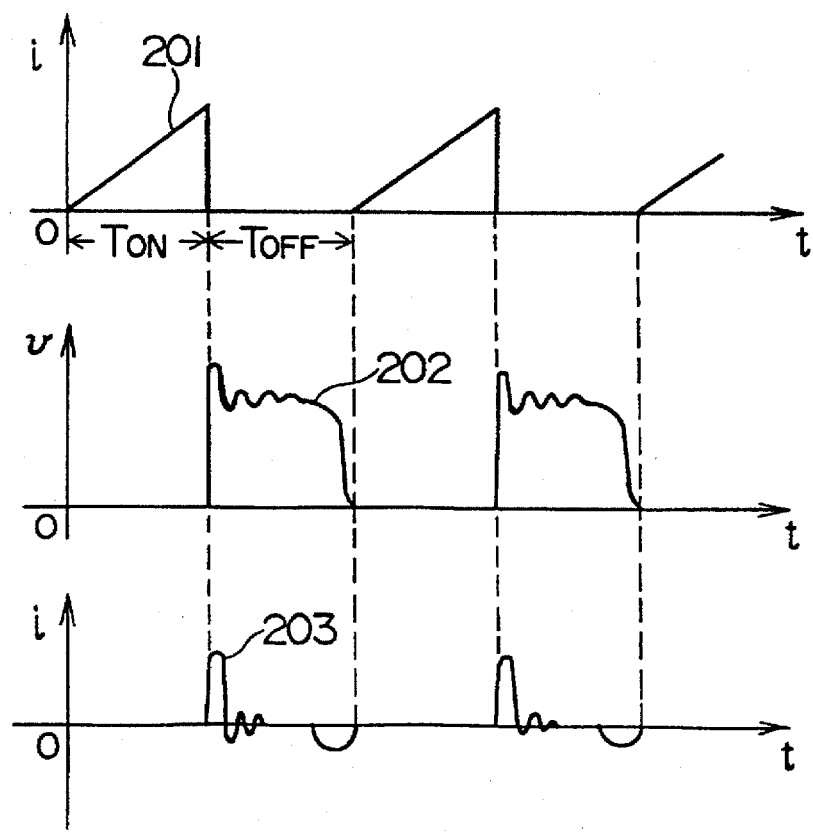
FIG. 2 is a diagram illustrating the waveforms of a drain current and a drain source voltage of a switching element and the waveform of a current of a snubber capacitor respectively in the switching power source shown in FIG. 1.

FIG. 2 shows the waveform of a drain current (201 in the diagram) and the waveform of a drain-source voltage (202 in the diagram) of the FET 5 and the waveform of a current (203 in the diagram) of the snubber capacitor 9 respectively in the self-excitation switching power source shown in FIG. 1. A look at the waveform 203 of the current of the snubber capacitor 9 reveals that the energy of the snubber capacitor 9 is discharged before the FET 5 enters into the ON period. This is because the saturable inductor 21 substantially delays the FET 5 in assuming the ON state.

In the self-excitation type switching power source of the embodiment described above, when the FET 5 is turned off, the snubber capacitor 9 is charged with the input voltage which is increased by the voltage generated in the primary winding 4. This voltage is discharged when the FET 5 is switched on. Since the self-excitation switching power source by nature produces a delay between assuming the ON and the OFF state and since this delay is increased by the delay produced by the saturable inductor 21 interposed between the positive feedback winding 6 and the FET 5, the duration of this total delay reaches one half of the period of the resonance between the snubber capacitor 9 and the primary winding 4 and the discharge current is substantially wholly regenerated on the input side. As a result, the decline of the efficiency can be prevented.

Figure 8:
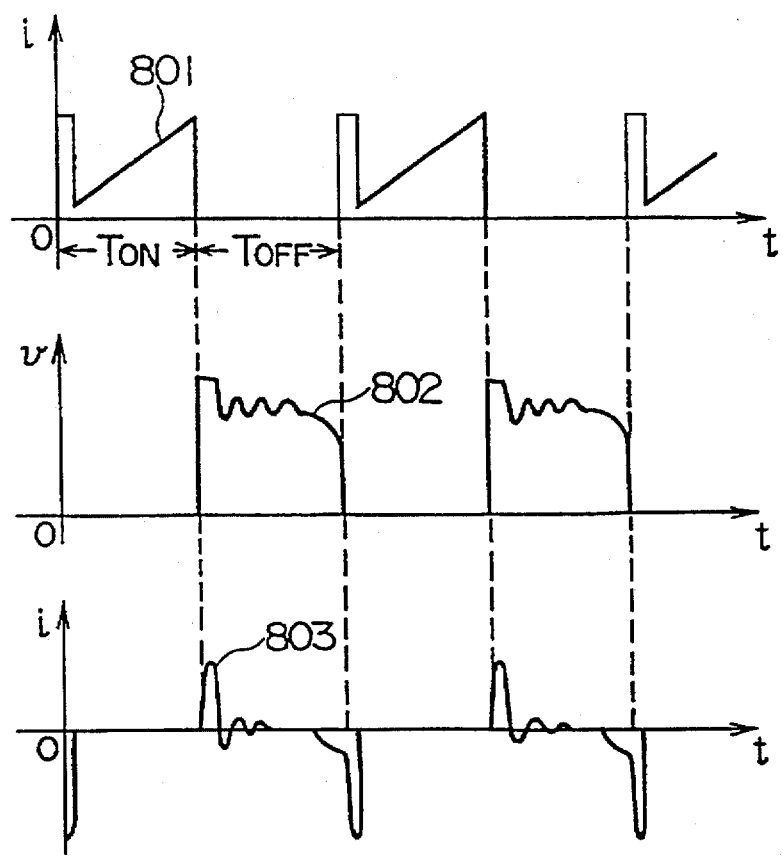
FIG. 8 is a diagram showing the waveforms of a drain current and a drain source voltage of a switching element and the waveform of a current in a snubber capacitor respectively in the conventional switching power source shown in FIG. 7.

In FIG. 8 are shown the waveform of a drain current (801 in the diagram) and the waveform of a drain-source voltage (802 in the diagram) of the FET 5 and the waveform of a current (803 in the diagram) of the snubber capacitor 9 respectively of the self-excitation type switching power source shown in FIG. 7. In the self-excitation switching power source, the voltage charged in the snubber capacitor 9 during the OFF state is discharged until 0 volt during the ON period and the period of resonance due to the inductance of the primary winding 4 and the capacity of the snubber capacitor 9 exists during the transition from the OFF period to the ON period as described above. In the conventional self-excitation switching power source shown in FIG. 7, the decline of the efficiency is suffered to occur because the greater part of the energy charged in the snubber capacitor 9 flows to the FET 5 while part of the energy is regenerated on the input side. This fact is evident from FIG. 8. A look at the waveform 803 of the current of the snubber capacitor 9 clearly reveals that the resonant current generated toward the end of the OFF period enters into the ON period and, at the same time, converts into a surge current which flows to the FET 5. This surge current induces the FET 5 to emit heat and forms a cause for noise in addition to degrading the efficiency of the power source. These drawbacks are eliminated by the self-excitation switching power source of the present embodiment as described above.

Now, a concrete example of the flyback type self-excitation switching power source whose configuration is shown in FIG. 1 and the results of evaluation thereof will be described below.

First, as the material for the construction of the saturable inductor 21, the magnetic materials shown in Table 1 below were prepared. Thin strips 16 μm in thickness of amorphous alloys (Samples No. 1 through No. 5) and Fe-based microcrystalline alloys (Samples No. 6 and No. 7) were each rolled into the shape of a core 4 mm in outside diameter, 2 mm in inside diameter, and 6 mm in height. The core furnished with 9 turns of a winding was used as a saturable inductor 21. A core formed of a ferrite in a similar shape and furnished with a similar winding was used as a saturable inductor 21. The switching power source using a given saturable inductor 21 was operated so as to produce an output power of 95 W and, meanwhile, was tested for efficiency (%) and noise (dBμV).

For comparison with this invention, the conventional circuit having no saturable inductor connected thereto (equivalent to the configuration of FIG. 7) was similarly operated and tested for efficiency (%) and noise (dBμV). The results are collectively shown in Table 1.

TABLE 1

|  | No. | Composition | Efficiency (%) | Noise (dBμV) |
|---|---|---|---|---|
| Example | 1 | $Co_{72}Fe_4Cr_2Si_8B_{14}$ | 88.4 | 50 |
|  | 2 | $Co_{73}Fe_4Nb_1Si_8B_{12}$ | 88.0 | 52 |
|  | 3 | $Co_{73}Fe_4Si_9B_{12}$ | 87.5 | 54 |
|  | 4 | $Co_{78}Fe_5Si_7B_{10}$ | 85.2 | 56 |
|  | 5 | $Fe_{78}B_8Si_{14}$ | 82.0 | 65 |
|  | 6 | $Fe_{89}Co_1Zr_7B_3$ | 86.2 | 55 |
|  | 7 | $Fe_{74}Nb_3Cu_1Si_{14}B_8$ | 87.0 | 54 |
|  | 8 | Ferrite | 83.0 | 63 |
| Comparative Example |  | (No saturable inductor used) | 81.2 | 70 |

It is clearly noted from Table 1 that the switching power sources embodying this invention by using a snubber circuit incorporating a saturable inductor therein manifested high levels of efficiency and high effects of repressing noise as compared with the conventional switching power source (Comparative Example). It is further noted that among other switching power sources embodying the present invention, the switching power sources using saturable inductors made of amorphous alloys and Fe-based microcrystalline alloys and especially those using saturable inductors of Co-based amorphous alloys and Fe-based microcrystalline alloys were particularly effective in enhancing the efficiency and repressing the noise.

In the same switching power source circuits as described above, saturable inductors were tested for characteristic property and effect. The results of this test will be described below. These saturable inductors were formed of a thin strip 16 μm in thickness of an amorphous alloy of the composition of $CO_{74}Fe_4Si_8B_{14}$ and were given characteristic properties varied by altering the shape of core and the number of turns of winding. The test was performed under the conditions of 100 kHz of operating frequency and 12 V of gate circuit voltage.

Figure 3:
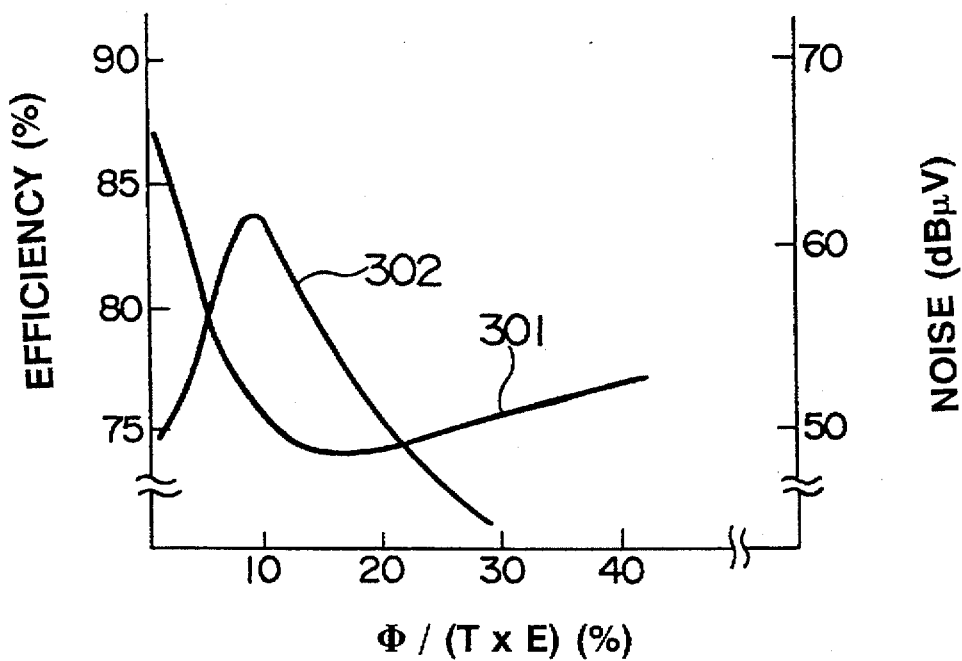
FIG. 3 is a graph showing the relations of the efficiency and the noise respectively to the ratio of the amount of magnetic flux, $\Phi$, to the product of the operating period, T, multiplied by the circuit voltage, E, namely $[\Phi/(T \times E)]$.
Figure 4:
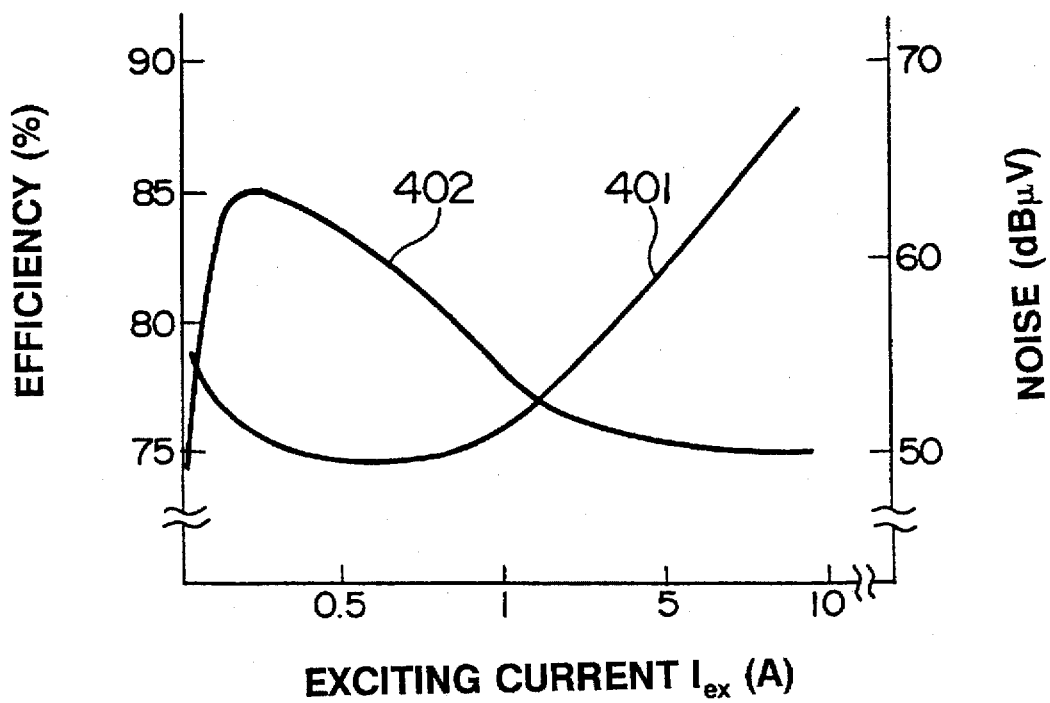
FIG. 4 is a graph showing the relations of the efficiency and the noise respectively to the exciting current, $I_{ex}$.

FIG. 3 shows the relations of the efficiency (%) and the noise (dBμV) respectively to the ratio of the amount of magnetic flux, $\Phi$ (Wb/m$^2$), to the product of the operating period, T (sec), multiplied by the circuit voltage, E (V), namely [$\Phi/(T\times E)$]. FIG. 4 shows the relations of the efficiency (%) and the noise (dBμV) respectively to the exciting current, $I_{ex}$ (A). In FIG. 3 and FIG. 4, the lines 301 and 401 represent the relations of the noise respectively to the $\Phi/(T\times E)$ ratio and the excitation current, $I_{ex}$, and the lines 302 and 402 represent the relations of the efficiency respectively to the $\Phi/(T\times E)$ ratio and the excitation current, $I_{ex}$.

Here, the efficiency (%) was determined by fixing the output at 100 W and measuring the input voltage. The noise (dBμV) was determined by fabricating a search coil, attaching this search coil to a given FET, and measuring the output of this search coil with a spectrum analyzer. The data of noise represent the peak values of the noise spectra which the switching power sources of the present embodiment produced in the neighborhood of 30 MHz.

It is clearly remarked from FIG. 3 that excellent levels of efficiency and effects in curbing noise were obtained when the ratios of the amount of magnetic flux, $\Phi$ (Wb/m$^2$), to the product of the operating period, T (sec), multiplied by the circuit voltage, E (V), namely [Φ/(T×E)], were in the range of from 2 to 20%. It is noted from FIG. 4 that excellent levels of efficiency and effects in curbing noise were obtained when the exciting current, $I_{ex}$, was not more than 3 A. Saturable inductors which used materials other than the Co-based amorphous alloys for their cores manifested similar results.

Figure 5:
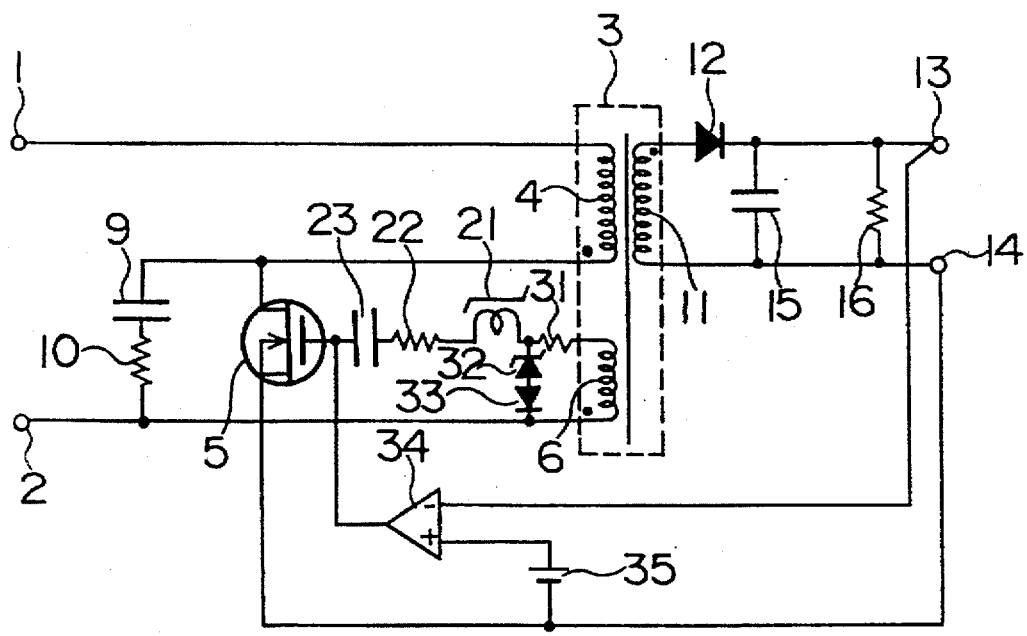
FIG. 5 is a circuit diagram of a flyback type self-excitation switching power source as another embodiment of this invention.

Now, the flyback type self-excitation switching power course as another embodiment of this invention will be described below with reference to FIG. 5. The switching power source of this embodiment fixes the voltage of the positive feedback winding 6 by passing this voltage through a regulator which consists of a resistor 31, a constant-voltage diode 32, and a reverse-blocking diode 33 so as to fix the voltage to be applied to the saturable inductor 21. As a result, the switching power source can be expected to operate with improved stability. In the diagram, the reference numeral 34 stands for a comparison amplifier for the output voltage and a reference voltage 35. The output of this comparison amplifier is utilized for controlling the operation of the FET 5.

Figure 6:
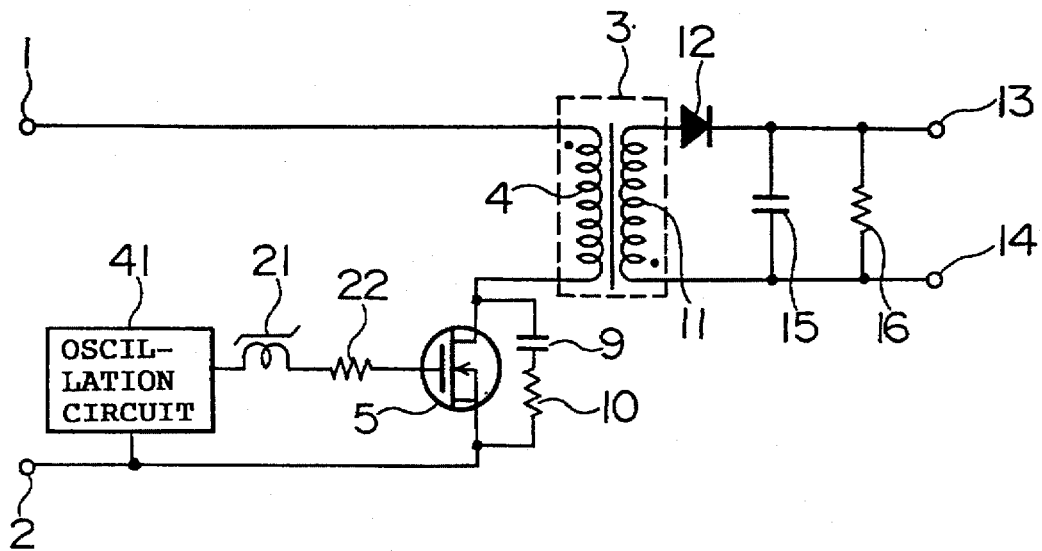
FIG. 6 is a circuit diagram of a flyback type separate excitation switching power source as another embodiment of this invention.

The embodiments described thus far represent cases of applying this invention to self-excitation switching power sources. This invention can manifest similar effects in flyback type separate excitation switching power sources. FIG. 6 is a circuit diagram of a flyback type separate excitation switching power source as one embodiment of this invention. This separate excitation switching power source has an oscillation circuit 41 as the drive circuit for the FET 5 which is a switching element. Between the FET 5 and the oscillation circuit 41, the resistor 22 and the saturable inductor 21 are connected in series. The snubber capacitor 9 and the snubber resistor 10 are also connected in parallel to the FET 5. Incidentally, the secondary winding 11 side of the transformer 3 in this switching power source is similar to that in the self-excitation switching power source shown in FIG. 1. This power source has the rectifying element 12 and the capacitor 15 so connected as to serve jointly as an output smoothing circuit. Here, the resistor 22 is freely connected in conjunction with the capacitor in the same manner as the self-excitation switching power source.

In the flyback type separate excitation switching power source constructed as described above, saturable inductors formed of materials of the compositions shown in Table 2 were tested for efficiency and noise in the same manner as in the self-excitation switching power source used in the working examples mentioned above. The results are shown in Table 2.

TABLE 2

| | No. | Composition | Efficiency (%) | Noise (dBμV) |
|---|---|---|---|---|
| Example | 9 | $Co_{72}Fe_4Ni_2Si_9B_{13}$ | 87.8 | 49 |
| | 10 | $Co_{75}Fe_4Mo_1Si_8B_{12}$ | 87.7 | 49 |
| | 11 | $Co_{74}Fe_4V_1Si_9B_{12}$ | 86.9 | 51 |
| | 12 | $Co_{78}Fe_5Si_5B_{12}$ | 85.0 | 54 |
| | 13 | $Fe_{78}Co_2B_{10}Si_{10}$ | 81.8 | 64 |
| | 14 | $Fe_{88}Co_1Zr_7B_4$ | 84.7 | 53 |
| | 15 | $Fe_{75}Nb_2Cu_1Si_{12}B_{10}$ | 85.3 | 56 |
| | 16 | Ferrite | 82.4 | 62 |
| Comparative Example | | (No saturable inductor used) | 80.5 | 68 |

It is clearly noted from Table 2 that the separate excitation switching power sources embodying this invention exhibited as satisfactory results as the self-excitation equivalents.

In Table 2, Samples No. 9 through No. 13 were made of amorphous alloys and Samples No. 15 and No. 16 were made of Fe-based microcrystalline alloys. These samples, when tested for the relation between the characteristic property of saturable inductor and the effect, exhibited similar results.

INDUSTRIAL APPLICABILITY

This invention permits repression of the rush current into the drive circuit for a switching element and the surge current as from the snubber circuit as described above. It can be utilized effectively, therefore, for the snubber circuit of low noise and high efficiency and further for the switching power source of low noise and high efficiency. Further, the saturable inductor of this invention can be effectively utilized for the snubber circuit and the switching power source.

We claim:

1. A snubber circuit suppressing surge and rush currents flowing to a switching element the snubber circuit being connected in series to a drive circuit for driving the switching element, the snubber circuit comprising:

a saturable inductor delaying an ON voltage applied to said switching element from said drive circuit, said saturable inductor having an exciting current, $I_{ex}$, of not more than 3 (A) and an amount of magnetic flux, Φ (Wb/m$^2$), in the range from 2% to 20% of the product of the operating period, T (sec), multiplied by a voltage (V) applied to said saturable inductor.

2. The snubber circuit according to claim 1, which further comprises a resistor connected in series to said saturable inductor.

3. The snubber circuit according to claim 1, which further comprises a capacitor connected in series to said saturable inductor.

4. The snubber circuit according to claim 1, wherein said saturable inductor is provided with a core made of a Co-based amorphous soft magnetic alloy.

5. The snubber circuit according to claim 1, wherein said saturable inductor is provided with a core made of an amorphous soft magnetic alloy or an iron-based soft magnetic alloy having microcrystalline particles.

6. A flyback type separate excitation switching power source comprising:

a transformer comprising a primary winding and a secondary winding;

a switching element connected in series to said primary winding of said transformer;

an oscillation circuit for actuating said switching element;

a saturable inductor, connected in series between said switching element and said oscillation circuit, suppressing surge and rush currents flowing to said switching element from said oscillation circuit by delaying an ON voltage from said oscillation circuit in reaching said switching element, said saturable inductor having an exciting current, $I_{ex}$, of not more than 3 (A) and an amount of magnetic flux, Φ (Wb/m$^2$), in the range from 2% to 20% of the product of the operating period, T (sec), multiplied by a voltage (V) applied to said saturable inductor; and a snubber capacitor connected parallel to said switching element.

7. A flyback type switching power source comprising:

a transformer comprising a primary winding and a secondary winding;

a switching element connected in series to said primary winding of said transformer;

a drive circuit for actuating said switching element; and a saturable inductor, connected in series between said switching element and said drive circuit, suppressing surge and rush currents flowing to said switching element from said drive circuit by delaying an ON voltage applied to said switching element from said drive circuit, said saturable inductor having an exciting current, $I_{ex}$, of not more than 3 (A) and an amount of magnetic flux, $\Phi$ (Wb/m$^2$), in the range from 2% to 20% of the product of the operating period, T (sec), multiplied by a voltage (V) applied to said saturable inductor.

8. The switching power source according to claim 7, which further comprises a snubber capacitor connected in parallel to said switching element.

9. The switching power source according to claim 7, which further comprises a resistor connected in series to said saturable inductor.

10. The switching power source according to claim 7, which further comprises a capacitor connected in series to said saturable inductor.

11. The switching power source according to claim 7, wherein said saturable inductor is provided with a core made of a Co-based amorphous soft magnetic alloy.

12. The switching power source according to claim 7, wherein said saturable inductor is provided with a core made of an amorphous soft magnetic alloy or an iron-based soft magnetic alloy having microcrystalline particles.

13. A flyback type self-excitation switching power source comprising:

a transformer comprising a primary winding and a secondary winding;

a switching element connected in series to said primary winding of said transformer;

a positive feedback winding provided in said transformer for self-exciting said switching element;

a saturable inductor, connected in series between said switching element and said positive feedback winding, suppressing surge and rush currents flowing to said switching element from said positive feedback winding by delaying an ON voltage applied to said switching element from said positive feedback winding, said saturable inductor having an exciting current, $I_{ex}$, of not more than 3 (A) and an amount of magnetic flux, $\Phi$ (Wb/m$^2$), in the range from 2% to 20% of the product of the operating period, T (sec), multiplied by a voltage (V) applied to said saturable inductor; and a snubber capacitor connected in parallel to said switching element.

14. A flyback type self-excitation switching power source comprising:

a transformer comprising a primary winding and a secondary winding;

a switching element connected in series to said primary winding of said transformer;

a positive feedback winding provided in said transformer for self-exciting said switching element; and a saturable inductor, connected in series between said switching element and said positive feedback winding, suppressing surge and rush currents flowing to said switching element from said positive feedback winding by delaying an ON voltage applied to said switching element from said positive feedback winding, said saturable inductor having an exciting current, $I_{ex}$, of not more than 3 (A) and an amount of magnetic flux, $\Phi$ (Wb/m$^2$), in the range from 2% to 20% of the product of the operating period, T (sec), multiplied by a voltage (V) applied to said saturable inductor.

15. A flyback type separate excitation switching power source comprising:

a transformer comprising a primary winding and a secondary winding;

a switching element connected in series to said primary winding of said transformer;

an oscillation circuit for actuating said switching element; and a saturable inductor, connected in series between said switching element and said oscillation circuit, suppressing surge and rush currents flowing to said switching element from said oscillation circuit by delaying an ON voltage from said oscillation circuit in reaching said switching element, said saturable inductor having an exciting current, $I_{ex}$, of not more than 3 (A) and an amount of magnetic flux, $\Phi$ (Wb/m$^2$), in the range from 2% to 20% of the product of the operating period, T (sec), multiplied by a voltage (V) applied to said saturable inductor.

16. A saturable inductor for use in a snubber circuit that suppresses surge and rush currents flowing to a switching element, the snubber circuit being connected in series to a drive circuit for driving the switching element the saturable inductor having an exciting current, $I_{ex}$, of not more than 3 (A) and an amount of magnetic flux, $\Phi$ (Wb/m$^2$), in the range from 2% to 20% of the product of the operating period, T (sec), multiplied by a voltage (V) applied to said saturable inductor.

17. A flyback type switching power source comprising:

a transformer comprising a primary winding and a secondary winding;

a switching element connected in series to said primary winding of said transformer;

a drive circuit for actuating said switching element;

a saturable inductor, connected in series between said switching element and said drive circuit, suppressing surge and rush currents flowing to said switching element from said driver circuit by delaying an ON voltage applied to said switching element from said drive circuit; and a snubber capacitor connected in parallel to said switching element.

* * * * *

UNITED STATES PATENT AND TRADEMARK OFFICE
CERTIFICATE OF CORRECTION

PATENT NO. : 5,745,353
DATED : April 28, 1998
INVENTOR(S) : Morio SATOH et al.

It is certified that error appears in the above-identified patent and that said Letters Patent is hereby corrected as shown below:

On the Title Page, item [54], in the title, line 2, "CURRENT" should read --CURRENTS--.

Claim 1, column 10, line 19, after "element", insert --,--.

Claim 16, column 12, line 37, after "element" insert --,--.

Signed and Sealed this

Twenty-ninth Day of September, 1998

Attest:

BRUCE LEHMAN

Attesting Officer

Commissioner of Patents and Trademarks